(12) United States Patent
Tanaka

(10) Patent No.: US 8,802,995 B2
(45) Date of Patent: Aug. 12, 2014

(54) ELECTRONIC COMPONENT INCLUDING MULTILAYER SUBSTRATE

(71) Applicant: Murata Manufacturing Co., Ltd., Kyoto-fu (JP)

(72) Inventor: Koji Tanaka, Kyoto-fu (JP)

(73) Assignee: Murata Manufacturing Co., Ltd, Kyoto-Fu (JP)

( * ) Notice: Subject to any disclaimer, the term of this patent is extended or adjusted under 35 U.S.C. 154(b) by 169 days.

(21) Appl. No.: 13/649,558

(22) Filed: Oct. 11, 2012

(65) Prior Publication Data

US 2013/0092419 A1 Apr. 18, 2013

Related U.S. Application Data

(63) Continuation of application No. PCT/JP2011/056011, filed on Mar. 15, 2011.

(30) Foreign Application Priority Data

Apr. 20, 2010 (JP) .................................. 2010-097415

(51) Int. Cl.
*H05K 1/03* (2006.01)
(52) U.S. Cl.
USPC .......................................... 174/255; 174/261
(58) Field of Classification Search
USPC ............................ 174/255, 261; 361/777–779
See application file for complete search history.

(56) References Cited

FOREIGN PATENT DOCUMENTS

| JP | 2002-324979 A | 11/2002 |
|----|---------------|---------|
| JP | 2003-017613 A | 1/2003 |
| JP | 2004-031699 A | 1/2004 |
| JP | 2004-356264 A | 12/2004 |
| JP | 2006-157880 A | 6/2006 |

OTHER PUBLICATIONS

International Search Report for PCT/JP2011/056011 dated Jun. 21, 2011.

*Primary Examiner* — Jeremy C Norris
(74) *Attorney, Agent, or Firm* — Pearne & Gordon LLP

(57) ABSTRACT

The multilayer substrate includes: a plurality of dielectric layers stacked on one another; a first conductor pattern 20 which is disposed along a principal surface 12a of a dielectric layer 12 and which is electrically connected to a ground; and second conductor patterns 22 and 24 which are disposed along the principal surface of a dielectric layer and which are opposed to the first conductor pattern 20 only through the dielectric layers therebetween, the second conductor patterns 22 and 24 forming inductor elements. Only the dielectric layers that sandwich the first conductor pattern 20 therebetween are bonded to each other via openings 20a through 20h formed in the first conductor pattern 20. As viewed from the stacking direction, the second conductor patterns substantially entirely overlap a portion other than the openings 20a through 20h in the first conductor pattern 20.

11 Claims, 4 Drawing Sheets

ELECTRONIC COMPONENT INCLUDING MULTILAYER SUBSTRATE

TECHNICAL FIELD

The present invention relates to an electronic component including a multilayer substrate, and more particularly, to an electronic component including a multilayer substrate in which a conductor pattern is disposed between dielectric layers.

BACKGROUND ART

Hitherto, various electronic components including a multilayer substrate in which a conductor pattern is disposed between dielectric layers have been proposed. For example, in a high-frequency module disclosed in Patent Document 1, a ground electrode 244 is formed, as shown in the plan view of FIG. 5, on substantially the entire surface of a dielectric layer 218 disposed within a multilayer substrate.

CITATION LIST

Patent Document

Patent Document 1: Japanese Unexamined Patent Application Publication No. 2006-157880

SUMMARY OF INVENTION

Technical Problem

In a multilayer substrate, dielectric layers and conductor patterns disposed between the dielectric layers are made of different materials. Accordingly, although the dielectric layers and the conductor patterns are in close contact with each other, a bonding force therebetween is weaker than that between the dielectric layers made of the same material. In particular, if a conductor pattern, which forms a ground electrode, is disposed in a wide range of a dielectric layer, a portion having a weak bonding force is continuously formed, thereby increasing the possibility of cracking or delamination occurring in the vicinity of interfaces between the dielectric layers and the conductor pattern.

In view of the above-described background, the present invention provides an electronic component including a multilayer substrate which can prevent the occurrence of cracking or delamination in the vicinity of interfaces between a conductor pattern and dielectric layers even if the conductor pattern is disposed in a wide range of the dielectric layer.

Solution to Problem

In order to solve the above-described problem, the present invention provides an electronic component including a multilayer substrate configured as follows.

The multilayer substrate of the electronic component includes: (a) a plurality of dielectric layers stacked on one another; (b) a first conductor pattern which is disposed along principal surfaces of the dielectric layers and which is electrically connected to a ground; and (c) a second conductor pattern which is disposed along the principal surfaces of the dielectric layers and which opposes is opposed to the first conductor pattern with only through the dielectric layers therebetween, the second conductor pattern forming an inductor element, a stripline, or a microstrip line, which is electrically connected to an element other than a ground. An opening is formed in the first conductor pattern, and only the dielectric layers that sandwich the first conductor pattern therebetween in a stacking direction of the dielectric layers are bonded to each other via the opening. As viewed from the stacking direction in which the dielectric layers are stacked, the second conductor pattern substantially entirely overlaps a portion other than the opening in the first conductor.

With the above-described configuration, even if the first conductor pattern is disposed in a wide range of a dielectric layer, the dielectric layers that sandwich the first conductor pattern therebetween are bonded to each other via the opening formed in the first conductor pattern, thereby strengthening a bonding force between the layers. That is, a bonding force between the dielectric layers is stronger than that between the dielectric layer and the first conductor pattern.

With the above-described configuration, by forming the opening in the first conductor pattern, it is possible to avoid the continuous presence of the portions having a weak bonding force in which the dielectric layers and the first conductor pattern are in contact with each other. As a result, the occurrence of cracking or delamination in the vicinity of interfaces between the dielectric layers and the first conductor pattern can be prevented.

Additionally, the second conductor pattern is entirely opposed to the first conductor pattern, which is electrically connected to a ground, only through the dielectric layers therebetween. Accordingly, the addition of the openings to the first conductor pattern does not influence the constant values (the inductances, etc.) of an inductor element formed by the second conductor pattern.

Preferably, the second conductor pattern may include an electrode for a capacitor element.

In this case, the addition of the opening to the first conductor pattern does not influence the constant values (the capacitances, etc.) of the capacitor element included in the second conductor pattern.

Preferably, as viewed from the stacking direction, the first conductor pattern may be disposed at an inner portion of the dielectric layer so that spacing is formed all around the first conductor pattern between the first conductor pattern and an outer periphery of the dielectric layer adjacent to the first conductor pattern.

In this case, the outer peripheral region of the dielectric layer adjacent to the first conductor pattern extends in a ring-like shape outside the first conductor pattern. The entire periphery of a portion having a relatively weak bonding force between the dielectric layer and the first conductor pattern is surrounded by a portion having a relatively strong bonding force between the peripheral regions of the dielectric layers that sandwich the first conductor pattern therebetween. Thus, a bonding force between the dielectric layers that sandwich the first conductor pattern therebetween is further strengthened. Additionally, a portion having a relatively weak bonding force between the first conductor pattern and the dielectric layers is not exposed from the side surfaces of the multilayer substrate, thereby making it possible to prevent the occurrence of interlayer cracking or delamination between the layers due to the impact from an external source.

Preferably, the first conductor pattern may be disposed on a portion which occupies 80% or higher of an area of the principal surface of the dielectric layer adjacent to the first conductor pattern.

If the first conductor pattern is disposed on substantially the entirety of the principal surface of the dielectric layer, the effect of strengthening a bonding force between the layers by forming the opening in the first conductor pattern becomes more noticeable.

Preferably, the dielectric layers may be made of low temperature co-fired ceramics.

In this case, when fabricating the multilayer substrate of the electronic component by using low temperature co-fired ceramics, by adjusting the shape, size, position, and number of the openings formed in the first conductor pattern, warpage of the multilayer substrate caused by a temperature change during firing can be reduced.

Advantageous Effects of Invention

In an electronic component including a multilayer substrate of the present invention, it is possible to prevent the occurrence of cracking or delamination in the vicinity of interfaces between a conductor pattern and dielectric layers even if the conductor pattern is disposed in a wide range of the dielectric layer.

DESCRIPTION OF EMBODIMENTS

Embodiments of the present invention will be described below with reference to FIGS. 1 through 4.

First Embodiment

An electronic component 10 including a multilayer substrate according to a first embodiment will be discussed below with reference to FIGS. 1 through 3.

Figure 1:
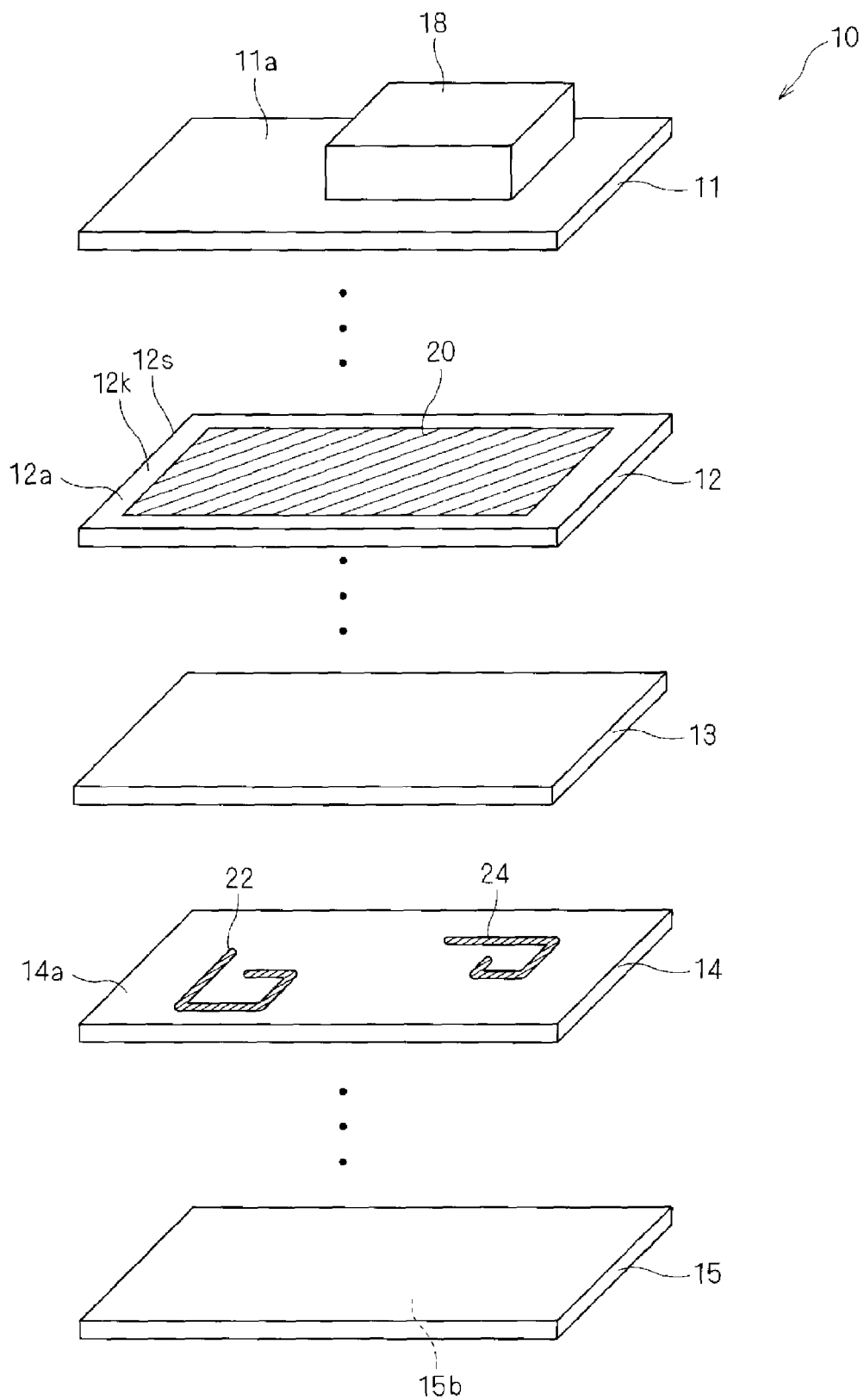
FIG. 1 is an exploded perspective view illustrating the schematic configuration of an electronic component including a multilayer substrate. (First Embodiment)

FIG. 1 is an exploded perspective view illustrating the schematic configuration of the electronic component 10 including a multilayer body according to the first embodiment. The electronic component 10 includes, as shown in FIG. 1, a multilayer substrate a plurality of dielectric layers stacked together. Dielectric layers other than dielectric layers 11 through 15 are not shown.

Conductor patterns possessing conductivity are formed on the top surfaces 11a, 12a, and 14a of the dielectric layers 11, 12, and 14, respectively. A conductor pattern (not shown) formed on the top surface 11a of the topmost dielectric layer 11 is an external electrode on which a component 18 is mounted. A first conductor pattern 20 formed on substantially the entirety of the top surface 12a of the intermediate dielectric layer 12 is a ground electrode, which is electrically connected to a ground. Second conductor patterns 22 and 24 formed on the top surface 14a of the intermediate dielectric layer 14 are spirally formed and form inductor elements.

A mounting electrode (not shown) for mounting the electronic component 10 on, for example, a circuit board is formed on a bottom surface 15b of the bottommost dielectric layer 15. A mounting electrode may be disposed on a side surface of the multilayer body, i.e., on an outer peripheral surface of a dielectric layer.

In addition to the conductor patterns 20, 22, and 24, conductor patterns formed along the top surfaces or the bottom surfaces of the dielectric layers and interlayer connecting conductors passing through the dielectric layers, such as ground electrodes, electrodes for capacitor elements, inductor elements, and lines, are formed, although such conductors are not shown. With these conductors, an electric circuit is formed within the multilayer substrate.

Figure 2:
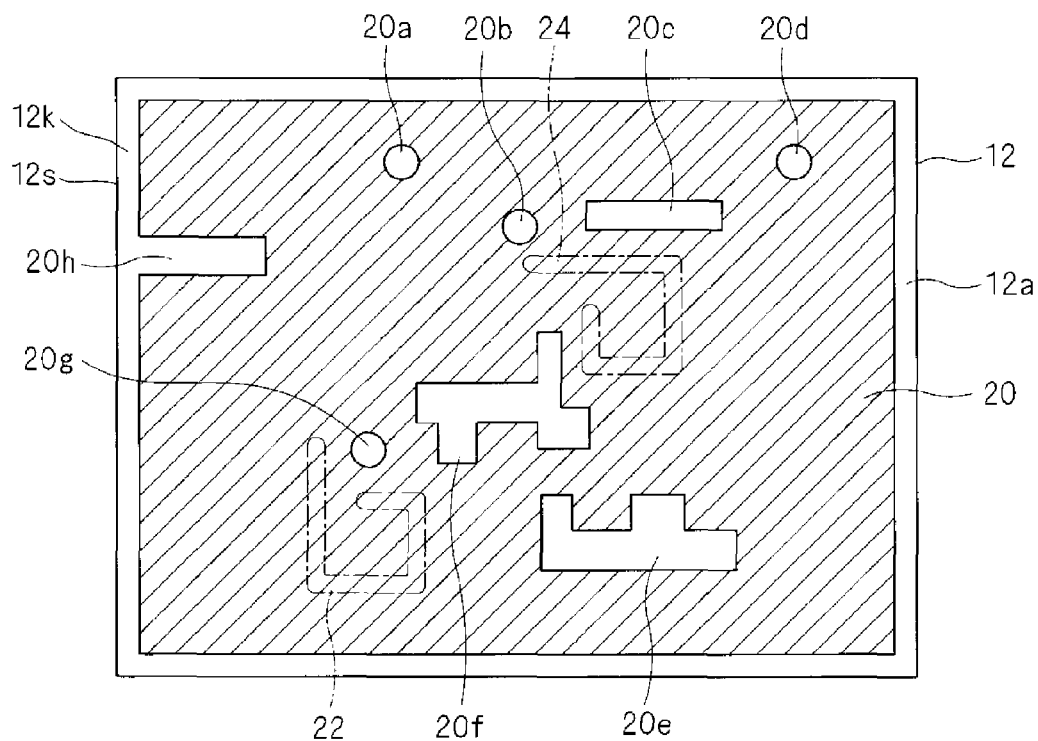
FIG. 2 is a plan view illustrating the top surface of a dielectric layer on which a first conductor pattern is disposed. (First Embodiment)
Figure 3:
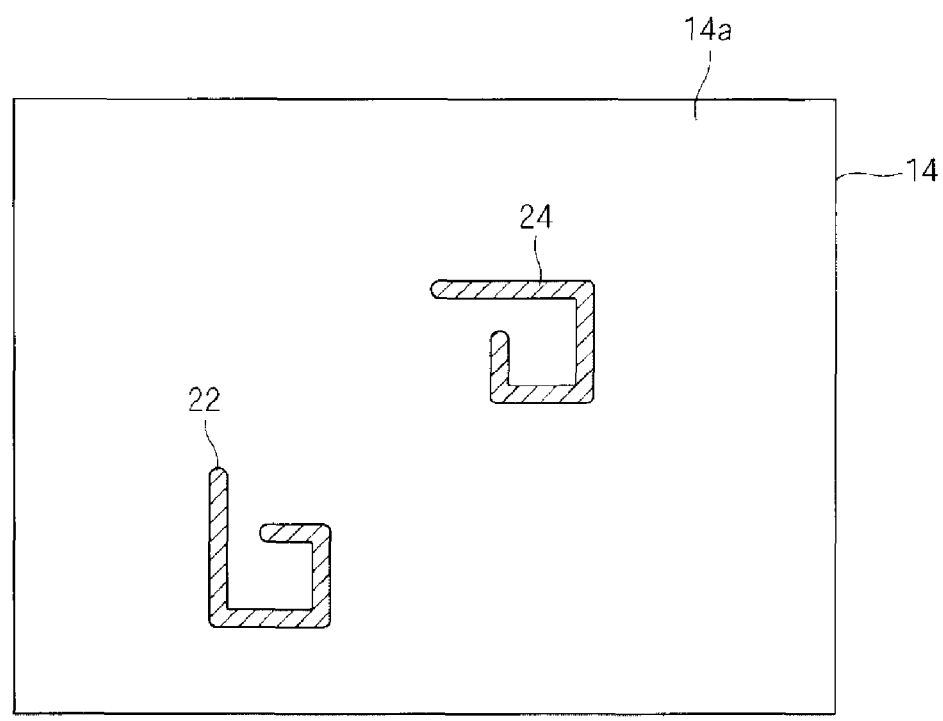
FIG. 3 is a plan view illustrating the top surface of a dielectric layer on which second conductor patterns are disposed. (First Embodiment)

FIG. 2 is a plan view illustrating the top surface 12a of the dielectric layer 12 on which the first conductor pattern 20 is disposed. FIG. 3 is a plan view illustrating the top surface 14a of the dielectric layer 14 on which the second conductor patterns 22 and 24 are disposed. As shown in FIG. 2, openings 20a through 20h are formed in the first conductor pattern 20, which is electrically connected to a ground.

The first conductor pattern 20 in which the openings 20a through 20h are formed is sandwiched between dielectric layers which are opposed to and adjacent to the principal surface of the first conductor pattern 20. Only the dielectric layers that sandwich the first conductor pattern 20 therebetween are bonded to each other via the openings 20a through 20h formed in the first conductor pattern 20. That is, only dielectric layers are present in the openings 20a through 20h, and elements other than the dielectric layers, such as conductor patterns or interlayer connecting conductors, are not present in the openings 20a through 20h.

A bonding force between dielectric layers is stronger than a bonding force between a dielectric layer and the first conductor pattern 20. Accordingly, even if the first conductor pattern 20 is disposed in a wide range of the dielectric layer 12, dielectric layers that sandwich the first conductor pattern 20 therebetween are bonded to each other via the openings 20a through 20h, thereby strengthening a bonding force between the layers. This makes it possible to avoid the continuous presence of the portions having a weak bonding force between the first conductor pattern 20 and dielectric layers that sandwich the first conductor pattern 20 therebetween. It is thus possible to prevent the occurrence of, for example, cracking or delamination, in the vicinity of interfaces between the dielectric layers and the first conductor pattern 20.

In particular, if the first conductor pattern 20 is disposed on substantially the entirety of the top surface 12a of the dielectric layer 12, i.e., on a portion which occupies 80% or higher of the area of the top surface 12a of the dielectric layer 12, the effect of strengthening a bonding force between layers by forming the openings 20a through 20h in the first conductor pattern 20 becomes more noticeable.

As viewed from the stacking direction, the first conductor pattern 20 is disposed at the inner portion of the dielectric layer so that spacing is formed all around the first conductor pattern 20 between the first conductor pattern 20 and an outer periphery 12s of the dielectric layer 12 which is adjacent to the first conductor pattern 20. That is, an outer peripheral region 12k of the dielectric layer 12 adjacent to the first conductor pattern 20 extends in a ring-like shape outside the first conductor pattern 20. The entire periphery of a portion having a weak bonding force between the dielectric layer 12 and the first conductor pattern 20 is surrounded by a portion having a strong bonding force between the peripheral regions of the dielectric layers that sandwich the first conductor pattern 20 therebetween. Thus, a bonding force between the dielectric layers that sandwich the first conductor pattern 20 therebetween is further strengthened. Additionally, a portion having a relatively weak bonding force between the first conductor pattern 20 and the dielectric layers is not exposed from the side surfaces of the multilayer substrate, thereby making it possible to prevent the occurrence of interlayer cracking or delamination between the layers due to the impact from an external source.

When viewing from the stacking direction, a region between the first conductor pattern 20 and the second conductor patterns 22 and 24 (i.e., a region including the dielectric layer 12, the dielectric layer 13 immediately above the dielectric layer 14, and dielectric layers (not shown) between the dielectric layers 12 and 13), the second conductor patterns 22 and 24 indicated by the long dashed dotted lines entirely overlap a portion other than the openings 20a through 20h in the first conductor pattern 20. That is, the second conductor patterns 22 and 24 are entirely opposed to the first conductor pattern 20 only through dielectric layers therebetween, and elements other than the dielectric layers, such as conductor patterns and interlayer connecting conductors, are not disposed within the region in which the second conductor patterns 22 and 24 are opposed to the first conductor layer 20. Accordingly, the addition of the openings 20a through 20h to the first conductor pattern 20 does not influence the constant values (the inductances, etc.) of inductor elements formed by the second conductor patterns 22 and 24.

The dielectric layers 11 through 15 are made of ceramics or resin.

In particular, if the dielectric layers are made of low temperature co-fired ceramics, a multilayer substrate is formed in the following manner. On ceramic green sheets formed by using low temperature co-fired ceramics, a conductor paste is printed by means of, e.g., printing, so as to form conductor patterns and interlayer connecting conductors. Then, the ceramic green sheets are stacked on one another and fired. As a result, a multilayer substrate is formed. By adjusting the shape, size, position, and number of the openings 20a through 20h formed in the first conductor pattern 20, warpage of the multilayer substrate caused by a temperature change during firing can be reduced.

Second Embodiment

An electronic component including a multilayer substrate according to a second embodiment will be described below with reference to FIG. 4.

Figure 4:
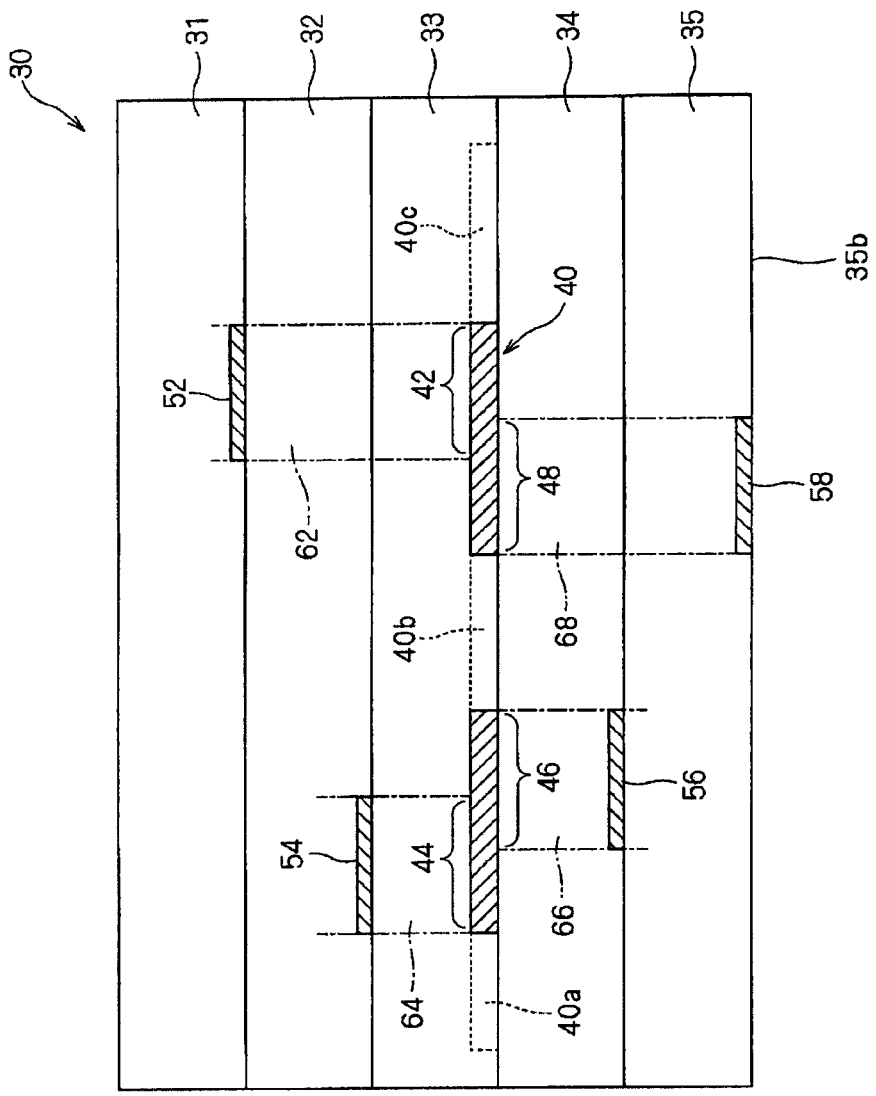
FIG. 4 is a sectional view illustrating a multilayer substrate of an electronic component. (Second Embodiment)
Figure 5:
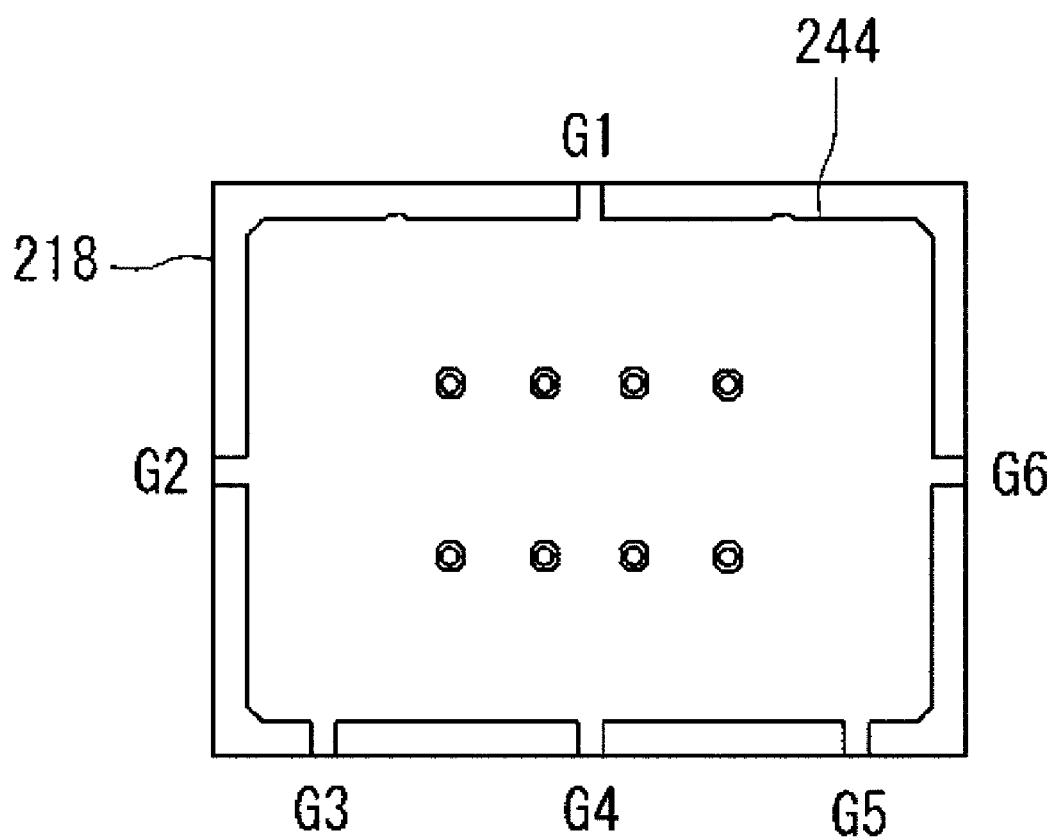
FIG. 5 is a plan view illustrating the top surface of a dielectric layer disposed within a multilayer substrate. (Example of the Related Art)

FIG. 4 is a sectional view illustrating a multilayer body 30 of an electronic component according to the second embodiment. The multilayer body 30 is formed, as shown in FIG. 4, by stacking a plurality of dielectric layers 31 through 35 on one another. A first conductor pattern 40, which is a ground electrode to be electrically connected to a ground, is formed between the third dielectric layer 33 and the fourth dielectric layer 34.

Second conductor patterns 52, 54, 56, and 58 are respectively formed between the first and second dielectric layers 31 and 32, between the second and third dielectric layers 32 and 33, between the fourth and fifth dielectric layers 34 and 35, and on a bottom surface 35b of the fifth dielectric layer 35. The second conductor pattern 52 is opposed to the first conductor pattern 40 only through the dielectric layers 32 and 33 therebetween. The second conductor pattern 54 is opposed to the first conductor pattern 40 only through the dielectric layer 33 therebetween. The second conductor pattern 56 is opposed to the first conductor pattern 40 only through the dielectric layer 34 therebetween. The second conductor pattern 58 is opposed to the first conductor pattern 40 only through the dielectric layers 34 and 35 therebetween. The second conductor patterns 52, 54, 56, and 58 form electrodes for capacitor elements, which are electrically connected to elements other than a ground or inductor elements.

Openings 40a, 40b, and 40c are formed in the first conductor pattern 40. Only the dielectric layers 33 and 34 that sandwich the first conductor pattern 40 therebetween are bonded to each other via the openings 40a, 40b, and 40c. The formation of the openings 40a, 40b, and 40c in the first conductor pattern 40 makes it possible to avoid the continuous presence of the portions having a weak bonding force in which the dielectric layers 33 and 34 are in contact with the first conductor pattern 40. Thus, it is possible to prevent the occurrence of cracking or delamination in the vicinity of the interfaces between the dielectric layers 33 and 34 and the first conductor pattern 40.

Openings other than the openings 40a, 40b, and 40c may be formed in the first conductor pattern 40, whereby not only dielectric layers, but also interlayer connecting conductors, etc. passing through the dielectric layers may be bonded to each other via openings other than the openings 40a, 40b, and 40c.

As viewed from the stacking direction (the vertical direction in FIG. 4) in which the dielectric layers 31 through 35 are stacked on one another, the second conductor patterns 52, 54, 56, and 58 overlap, as a whole, portions other than the openings 40a, 40b, and 40c in the first conductor pattern 40. That is, the opening 40a, 40b, or 40c is not formed in regions 42, 44, 46, and 48. In the region 42, the second conductor pattern 52 is opposed to the first conductor pattern 40 only through the dielectric layers 32 and 33 therebetween. In the region 44, the second conductor pattern 54 is opposed to the first conductor pattern 40 only through the dielectric layer 33 therebetween. In the region 46, the second conductor pattern 56 is opposed to the first conductor pattern 40 only through the dielectric layer 34 therebetween. In the region 48, the second conductor pattern 58 is opposed to the first conductor pattern 40 only through the dielectric layers 34 and 35 therebetween.

The second conductor patterns 52, 54, 56, and 58 are entirely opposed to the first conductor pattern 40, which is electrically connected to a ground, only through the dielectric layers 32 and 33 therebetween, the dielectric layer 33 therebetween, the dielectric layer 34 therebetween, and the dielectric layers 34 and 35 therebetween, respectively. Accordingly, the addition of the openings 40a, 40b, and 40c to the first conductor pattern 40 does not influence the constant values (the capacitances, inductances, etc.) of the capacitor elements or inductor elements formed by the second conductor patterns 52, 54, 56, and 58.

When stacking dielectric layers on one another, the positions at which the dielectric layers overlap each other may be displaced, which may cause the positions of the conductor patterns to be displaced. This may change the constant values of the capacitor elements or inductor elements formed by the conductor patterns. In order to prevent this from happening, the second conductor patterns 52, 54, 56, and 58 may be respectively formed larger than the regions 42, 44, 46, and 48, which are opposed to the second conductor patterns 52, 54, 56, and 58, respectively, of the first conductor pattern 40, and vice versa. That is, it is sufficient that the second conductor patterns 52, 54, 56, and 58 are substantially entirely opposed to the first conductor pattern 40, which is electrically connected to a ground, only through the dielectric layers 32 and 33 therebetween, the dielectric layer 33 therebetween, the dielectric layer 34 therebetween, and the dielectric layers 34 and 35 therebetween, respectively.

Summary

As described above, a bonding force between the layers are strengthened by forming the openings in the first conductor pattern, which forms a ground electrode, thereby making it possible to prevent the occurrence of, for example, cracking or delamination, in the vicinity of the interfaces between the dielectric layers and the first conductor pattern.

The present invention is not restricted to the above-described embodiments, and may be carried out by making various modifications to the embodiments.

For example, the second conductor patterns are not limited to electrodes for capacitor elements or inductor elements, which are electrically connected to elements other than a ground. Instead, the second conductor patterns may form striplines or microstrip lines.

REFERENCE SIGNS LIST 10 electronic component
11 to 15 dielectric layers
11a, 12a, 14a top surfaces (principal surfaces)
18 component
20 first conductor pattern
20a to 20h openings
22, 24 second conductor patterns
30 multilayer substrate
31 to 35 dielectric layers
40 first conductor pattern
40a, 40b, 40c openings
52, 54, 56, 58 second conductor patterns

The invention claimed is:

1. An electronic component including a multilayer substrate, the multilayer substrate comprising:
   a plurality of dielectric layers stacked on one another;
   a first conductor pattern which is disposed along principal surfaces of the dielectric layers and which is electrically connected to a ground; and
   a second conductor pattern which is disposed along the principal surfaces of the dielectric layers and which is opposed to the first conductor pattern only through the dielectric layer therebetween, the second conductor pattern forming an inductor element, a stripline, or a microstrip line, which is electrically connected to an element other than a ground,
   wherein an opening is formed in the first conductor pattern, and only the dielectric layers that sandwich the first conductor pattern therebetween in a stacking direction of the dielectric layers are bonded to each other via the opening, and
   wherein, as viewed from the stacking direction in which the dielectric layers are stacked, the second conductor pattern substantially entirely overlaps portions other than the openings in the first conductor.

2. The electronic component including the multilayer substrate according to claim 1, wherein the second conductor pattern includes an electrode for a capacitor element.

3. The electronic component including the multilayer substrate according to claim 1, wherein, as viewed from the stacking direction, the first conductor pattern is disposed at an inner portion of the dielectric layer so that spacing is formed all around the first conductor pattern between the first conductor pattern and an outer periphery of the dielectric layer adjacent to the first conductor pattern.

4. The electronic component including the multilayer substrate according to claim 1, wherein the first conductor pattern is disposed on a portion which occupies 80% or higher of an area of the principal surface of the dielectric layer adjacent to the first conductor pattern.

5. The electronic component including the multilayer substrate according to claim 1, wherein the dielectric layers are made of low temperature co-fired ceramics.

6. The electronic component including the multilayer substrate according to claim 2, wherein, as viewed from the stacking direction, the first conductor pattern is disposed at an inner portion of the dielectric layer so that spacing is formed all around the first conductor pattern between the first conductor pattern and an outer periphery of the dielectric layer adjacent to the first conductor pattern.

7. The electronic component including the multilayer substrate according to claim 2, wherein the first conductor pattern is disposed on a portion which occupies 80% or higher of an area of the principal surface of the dielectric layer adjacent to the first conductor pattern.

8. The electronic component including the multilayer substrate according to claim 3, wherein the first conductor pattern is disposed on a portion which occupies 80% or higher of an area of the principal surface of the dielectric layer adjacent to the first conductor pattern.

9. The electronic component including the multilayer substrate according to claim 2, wherein the dielectric layers are made of low temperature co-fired ceramics.

10. The electronic component including the multilayer substrate according to claim 3, wherein the dielectric layers are made of low temperature co-fired ceramics.

11. The electronic component including the multilayer substrate according to claim 4, wherein the dielectric layers are made of low temperature co-fired ceramics.

* * * * *